(12) United States Patent
Karhade et al.

(10) Patent No.: US 10,672,626 B2
(45) Date of Patent: Jun. 2, 2020

(54) METHOD AND MATERIALS FOR WARPAGE THERMAL AND INTERCONNECT SOLUTIONS

(71) Applicant: Intel Corporation, Santa Clara, CA (US)

(72) Inventors: Omkar G. Karhade, Chandler, AZ (US); Nitin A. Deshpande, Chandler, AZ (US); Aditya S. Vaidya, Tempe, AZ (US); Nachiket R. Raravikar, Gilbert, AZ (US); Eric J. Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 321 days.

(21) Appl. No.: 15/469,284

(22) Filed: Mar. 24, 2017

(65) Prior Publication Data
US 2017/0200621 A1 Jul. 13, 2017

Related U.S. Application Data

(62) Division of application No. 14/229,788, filed on Mar. 28, 2014, now Pat. No. 9,607,964.

(51) Int. Cl.
*H01L 21/56* (2006.01)
*H01L 21/768* (2006.01)
(Continued)

(52) U.S. Cl.
CPC ......... *H01L 21/565* (2013.01); *H01L 21/561* (2013.01); *H01L 21/76879* (2013.01);
(Continued)

(58) Field of Classification Search
CPC .................................................. H01L 21/76882
See application file for complete search history.

(56) References Cited

U.S. PATENT DOCUMENTS

| 2005/0121774 | A1* | 6/2005 | Waldvogel | .......... | H01L 23/3677 |
| | | | | | 257/706 |
| 2011/0292567 | A1* | 12/2011 | McConnell | .......... | B23K 1/0016 |
| | | | | | 361/321.2 |

(Continued)

FOREIGN PATENT DOCUMENTS

WO    WO-2013132954 A1 *  9/2013 ............... B23K 1/00

*Primary Examiner* — Moazzam Hossain
(74) *Attorney, Agent, or Firm* — Schwabe, Williamson & Wyatt, P.C.

(57) ABSTRACT

Embodiments describe a semiconductor package that includes a substrate, a die bonded to the substrate, and a solder paste overmold layer formed over a top surface of the die. In an embodiment, the solder paste comprises a high-melting point metal, a solder matrix, intermetallic compounds and a polymer. The overmold layer has a high elastic modulus, a coefficient of thermal expansion similar to the substrate, and reduces the warpage of the package. In an embodiment, interconnects of a semiconductor package are formed with a no-slump solder paste that includes vents. Vents may be formed through a conductive network formed by the high-melting point metal, solder matrix and intermetallic compounds. In an embodiment, vents provide a path through the interconnect that allows for moisture outgassing. In an embodiment, a mold layer may be mechanically anchored to the interconnects by the vents, thereby providing improved mechanical continuity to the mold layer.

7 Claims, 8 Drawing Sheets

(51) Int. Cl.
*H01L 21/78* (2006.01)
*H01L 23/498* (2006.01)
*H01L 25/10* (2006.01)
*H01L 25/00* (2006.01)
*H01L 25/065* (2006.01)
*H01L 23/00* (2006.01)
*H01L 23/31* (2006.01)

(52) U.S. Cl.
CPC ........ *H01L 21/76883* (2013.01); *H01L 21/78* (2013.01); *H01L 23/49811* (2013.01); *H01L 24/92* (2013.01); *H01L 25/0657* (2013.01); *H01L 25/105* (2013.01); *H01L 25/50* (2013.01); *H01L 23/3121* (2013.01); *H01L 24/13* (2013.01); *H01L 24/16* (2013.01); *H01L 24/29* (2013.01); *H01L 24/32* (2013.01); *H01L 24/48* (2013.01); *H01L 24/81* (2013.01); *H01L 24/83* (2013.01); *H01L 2224/131* (2013.01); *H01L 2224/16227* (2013.01); *H01L 2224/2919* (2013.01); *H01L 2224/32145* (2013.01); *H01L 2224/32227* (2013.01); *H01L 2224/48227* (2013.01); *H01L 2224/73204* (2013.01); *H01L 2224/73265* (2013.01); *H01L 2224/81203* (2013.01); *H01L 2224/81815* (2013.01); *H01L 2224/83104* (2013.01); *H01L 2224/83203* (2013.01); *H01L 2224/83815* (2013.01); *H01L 2224/92* (2013.01); *H01L 2225/0651* (2013.01); *H01L 2225/06562* (2013.01); *H01L 2924/00014* (2013.01); *H01L 2924/014* (2013.01); *H01L 2924/12042* (2013.01); *H01L 2924/15311* (2013.01); *H01L 2924/181* (2013.01); *H01L 2924/3511* (2013.01)

(56) References Cited

U.S. PATENT DOCUMENTS

2013/0087605 A1* 4/2013 Kubota ................... H01L 24/24
                                                        228/256
2013/0270685 A1* 10/2013 Yim ........................ H01L 23/10
                                                        257/686

* cited by examiner

METHOD AND MATERIALS FOR WARPAGE THERMAL AND INTERCONNECT SOLUTIONS

CROSS-REFERENCE TO RELATED APPLICATIONS

This application is a divisional of and claims the benefit of U.S. patent application Ser. No. 14/229,788, titled "Novel Method and Materials for Warpage Thermal and Interconnect Solutions", filed Mar. 28, 2014, now U.S. Pat. No. 9,607,964, the entire contents of which is hereby incorporated by reference in its entirety for all purposes.

FIELD OF THE INVENTION

Embodiments of the present invention relate generally to the manufacture of semiconductor devices. In particular, embodiments of the present invention relate to package-on-package (PoP) devices.

BACKGROUND AND RELATED ARTS

Three dimensional packaging, such as a package-on-package (PoP) devices, presently require through mold interconnects in order to provide adequate stand-off heights. FIG. 1A, is an example of a prior art solution for providing the needed stand-off height. As shown, the through mold vias formed through a molding layer 160 are filled with solder bumps 144 to form the through mold interconnects. The solder bumps 144 block the opening and there is no path for moisture outgassing. As a result, the pressure below the solder bump increases until the pressure is finally able to lift the solder bumps 144 off of the substrate 101, as shown in FIG. 2B. Current solutions to prevent the solder bumps 144 from lifting off of the substrate 101 include overdrilling the cavity around the top side of the solder balls. However, overdrilling requires a larger pitch between through mold interconnects.

Furthermore, as the thicknesses of dies and substrates decrease, thermal effects are amplified, and the package becomes more susceptible to warpage. The use of through mold vias produces a non-continuous mold layer 160. Without mechanical continuity, the mold layer is not as effective at preventing warpage. Additionally, the mold layer 160 is typically a polymeric or epoxy material. Such materials have a large coefficient of thermal expansion (CTE) and a low elastic modulus. Accordingly, a thick layer is needed in order to provide mechanical support to the package in order to minimize warpage.

DETAILED DESCRIPTION

Embodiments are directed to a semiconductor package having a plurality of interconnects formed with a no-slump solder paste. In an embodiment, the interconnects are cured with a liquid phase sintering process to form a conductive network through the interconnects. A polymer component of the no-slump solder paste may be volatilized after the curing process. The evacuated regions of the interconnects create a system of vents through which moisture may outgas. In an embodiment, the vents have an average diameter that is smaller than the particle size of a mold layer formed over the interconnects. In an embodiment, the vents provide anchoring points that increase the mechanical continuity of the mold layer.

Additional embodiments are directed to a semiconductor package having an overmold layer formed with a no-slump solder paste formed over a die bonded to a substrate. According to an embodiment, the overmold layer formed with a no-slump solder paste has a high elastic modulus and a CTE that is substantially similar to the substrate. The overmold layer may also have a high thermal conductivity. In an embodiment, the overmold layer decreases the warpage of the package. In an embodiment, the overmold layer may be formed over the die after the die has been bonded to the substrate. In an additional embodiment, the overmold layer may be formed over the die prior to the die being singulated from a wafer having a plurality of dies formed thereon.

Figure 1A:
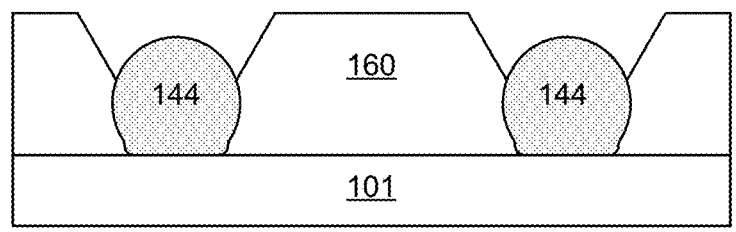
FIGS. 1A-1B illustrate cross-sectional views of a prior art PoP interconnect.
Figure 1B:
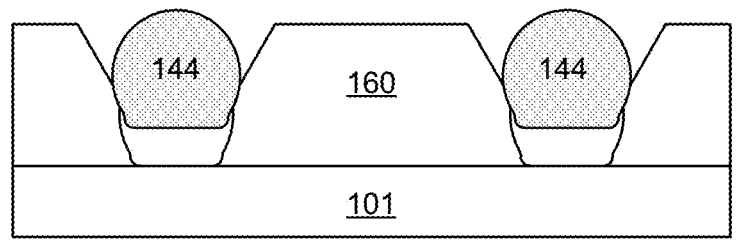
Figure 2A:
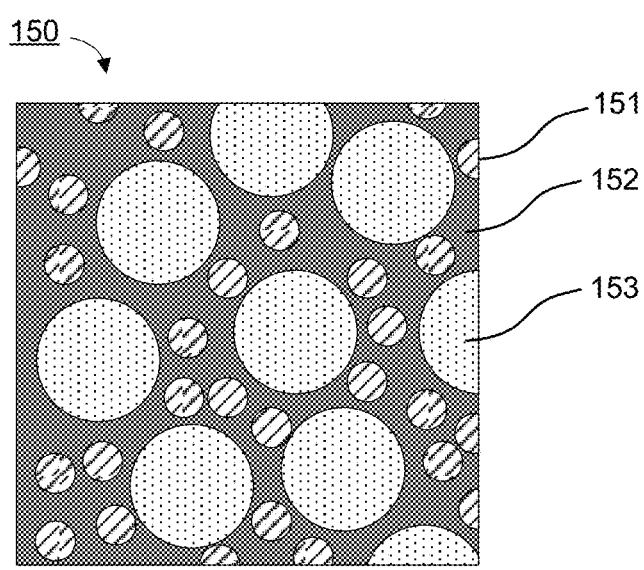
FIGS. 2A-2C illustrate exemplary views of the microstructure of uncured, cured, and volatilized no-slump solder paste according to various embodiments.
Figure 2B:
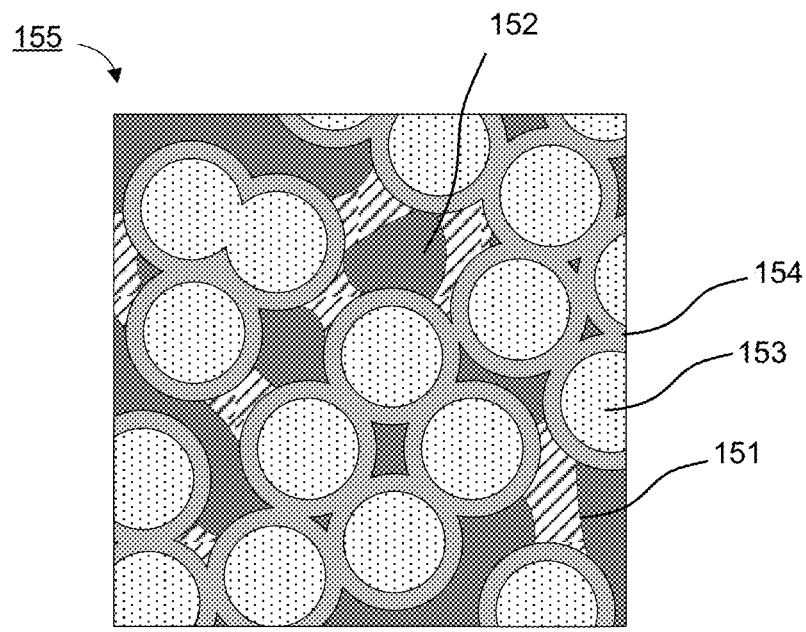
Figure 2C:
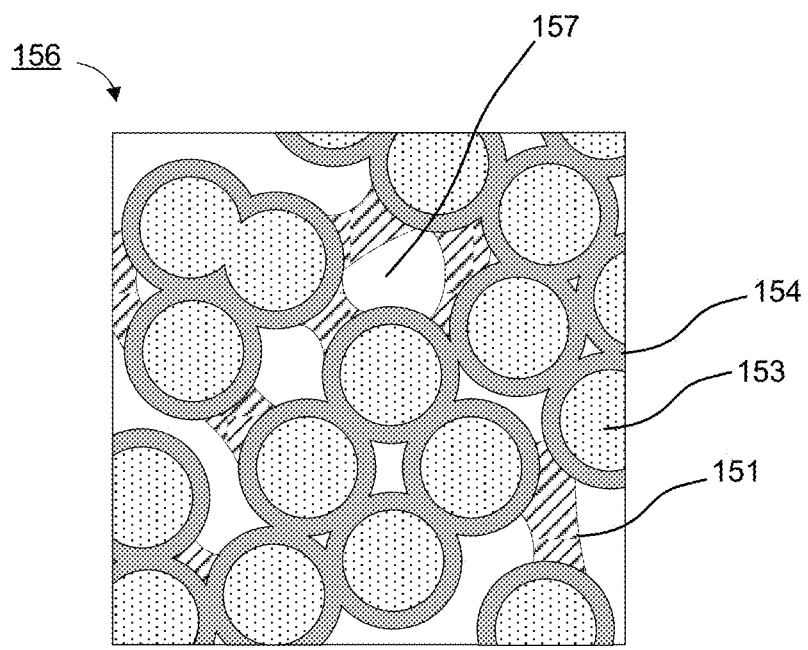

Referring now to FIGS. 2A-2C, exemplary depictions of the microstructures of uncured, cured, and volatilized no-slump solder pastes that may be used to form the volatilized interconnects and/or overmold layers according to various embodiments are shown.

FIG. 2A is an exemplary depiction of the microstructure of an uncured no-slump solder paste 150 according to an embodiment. According to an embodiment, a no-slump solder paste may include particles or spheres of a high-melting point metal 153, particles of a solder matrix 151, and a polymer 152.

According to an embodiment, the high-melting point metal 153 has a melting temperature above the reflow temperature of a typical first level interconnect (FLI) solder, such as, for example, SAC305 or SAC405. By way of example, and not by way of limitation, the high-melting point metal 153 may have a melting temperature greater than 280° C. By way of example, and not by way of limitation, the high melting point metal 153 may be particles or spheres of copper (Cu) or its alloys, or nickel (Ni) or its alloys. According to an embodiment, the solder matrix 151 may be a low-melting point solder. In an embodiment, a low-melting point solder may be a solder that melts at a temperature below 200° C. By way of example, and not by way of limitation, a low melting point solder may be a SnBi solder, SnIn solder, SiInBi solder, or similar combinations of these and other alloys.

According to an embodiment, the polymer 152 provides the desired rheology that enables stencil printing or ink jetting. Additionally, the polymer provides the desired thixotropic properties that allows the no-slump solder paste to flow while being printed or ink jetted and remain highly viscous afterwards in order to prevent slumping. According to an embodiment, polymer 152 is only needed during the solder printing process used to form the interconnects on the substrate. As such, embodiments include a polymer 152 that can be at least partially removed after it is no longer needed. According to an embodiment, the polymer 152 may be a low molecular weight polymer, oligomer, or epoxy. By way of example, polymer 152 may have a molecular weight that is approximately 2,000 Daltons (Da) or less. In additional embodiments, the no-slump solder paste 150 may further comprise a solvent and a fluxing agent. A solvent may be used to improve the rheological and thixotropic properties of the no-slump solder paste in order to improve the printability. The fluxing agent may be used to remove oxides that may be formed on of the metal components of the no-slump solder paste. According to an additional embodiment, the no-slump solder paste 150 may include a polymer that has a molecular weight greater than approximately 2,000 Da. No-slump solder pastes according to such embodiments may be used when the paste does not need to be volatilized. For example, a no-slump solder paste used to form an overmold layer to reduce the warpage in a package may not be volatilized.

By way of example, and not by way of limitation, the uncured no-slump solder paste 150 may have a composition of approximately 10-30% (by volume) polymer 152 and approximately 70-90% (by volume) metal (including both the high-melting point metal 153 and the solder matrix 151). In an embodiment, the uncured no-slump solder paste 150 may have a composition of approximately 10% (by volume) polymer 152 and approximately 90% (by volume) metal (including both the high-melting point metal 153 and the solder matrix 151). According to an embodiment, the weight percent of the high melting-point metal 153 and the solder matrix 151 may be chosen depending on the desired current density needed for the material. By way of example, when a high current density is needed, the high-melting point metal 153 may account for approximately 50% or more of the weight of the no-slump solder paste 150. In embodiments that do not require high current densities, the solder matrix 151 may account for approximately 50% or more of the weight of the no-slump solder paste. Increasing the weight percentage of the solder matrix 151 allows for a more compliant material.

According to an embodiment, the average diameter of the particles of the high-melting point metal 153 is approximately one-third or less of the width of a stencil opening used to print the no-slump solder paste 150. In an embodiment, the average diameter of the particles of the high-melting point metal 153 is approximately one-fourth or less of the width of the stencil opening used to print the no-slump solder paste 150. In an embodiment, the average diameter of the particles of the high-melting point metal 153 is approximately one-tenth or less of the width of the stencil opening used to print the no-slump solder paste 150. By way of example, and not by way of limitation, the diameter of the particles of the high-melting point metal 153 may be less than approximately 50 μm. By way of example, and not by way of limitation, the diameter of the particles of the high-melting point metal 153 may be less than approximately 10 μm.

Referring now to FIG. 2B, an exemplary depiction of the microstructure of a cured no-slump solder paste 155 according to an embodiment is shown. As shown, the cured no-slump solder paste 155 forms a conductive network with portions of the solder matrix 151 having melted and solidified to form conductive bridges between the high-melting point particles 153. Additionally, the curing process has produced an intermetallic compound shell 154 around the surfaces of the high-melting point particles 153. According to an embodiment, the conductive network may also include portions of intermetallic compound shells 154 that have sintered together through solid-state diffusion bonding. According to an embodiment, the high-melting point particles 153 may also undergo solid-state diffusion bonding with intermetallic compound shells 154 to form a portion of the conductive network. According to an embodiment, the high-melting point particles 153 may sinter together with solid-state diffusion bonding to form a portion of the conductive network. According to an embodiment, the cured no-slump solder paste 155 has a high reflow temperature, such as, for example, greater than 400° C.

In embodiments with low melting point solders, the curing process may include a liquid phase sintering process. In embodiments that include a solvent, the curing process may first include removing the solvent. By way of example, and not by way of limitation, the solvent may be removed by holding the temperature between approximately 115° C. and 120° C. for approximately 20 minutes. According to an embodiment, a fluxing agent may also remove oxides from metallic surfaces during the first temperature hold. Thereafter, the temperature may be ramped up to between 200° C. and 250° C. In an exemplary embodiment including Cu particles 153 and a SnBi solder matrix 151, the SnBi solder matrix will melt at temperatures between approximately 145° C. and 190° C. The liquid phases of the Sn and Bi and the solid Cu particles 153 are suspended in the polymer resin 152. The liquid phase Sn and Bi may also wet the surfaces of the Cu particles 153. At temperatures between approximately 200° C. and 250° C., the liquid Sn begins to sinter with the surfaces of the Cu particles 153. The liquid phase sintering produces an intermetallic compound shell 154 around the Cu particles 153. In an embodiment, the intermetallic compounds may include $Cu_6Sn_5$, $Cu_3Sn$, $Cu_3Sn_8$, and/or $Cu_4Sn$. These intermetallic compounds each have melting temperatures above approximately 400° C. During the temperature hold, sintering between the solid Cu particles 153 and solid intermetallic compounds 154 may occur as well.

According to additional embodiments, portions of the liquid Bi may also sinter with the solid Cu particles 153 to form intermetallic compounds comprising Cu, Sn, and Bi. Additionally, the sintering of liquid Sn with the Cu particles 153 reduces the Sn content in the liquefied solder matrix 151. Accordingly, the melting temperature of the remaining unsintered solder matrix 151 is increased towards the melting temperature of pure Bi, which is 271.5° C. According to an embodiment, substantially all of the solder matrix 151 may be consumed during the curing process.

According to an embodiment, a sufficient amount of liquid phase sintering is obtained when the temperature is held at 210° C. for approximately 15 minutes. According to additional embodiments, higher temperatures may be used with a lower hold length. In an embodiment, the sintering temperature may be below 200° C. when longer hold times are used. By way of example, and not by way of limitation, a 60 minute hold at approximately 190° C. or a 120 minute hold at approximately 165° C. are sufficient to form Cu—Sn intermetallic compounds 154. Once the no-slump solder paste has been cured, the solder paste 155 will not reflow during subsequent packaging processes due to the increase in the melting temperature that results from the formation of intermetallic compounds 154 and the reduction of the Sn content in the SnBi solder matrix 151. According to an embodiment, the remaining Bi-heavy solder matrix may melt at elevated temperatures, however, due to the presence of Cu particles 153 with Cu—Sn intermetallic compound shells 154, the cured no-slump solder paste 155 will substantially maintain its shape and not slump. By way of example, and not by way of limitation, when a no-slump solder paste 155 is formed into interconnect columns having a pitch between 200 μm and 350 μm, widths between 100 μm and 200 μm, and stand-off heights between 130 and 300 μm, the widths of the interconnects will not extend outwards (i.e., slump) enough to contact neighboring interconnects. According to an embodiment, the dimensional change of the width of a no-slump solder paste 155 interconnect is less than 1%. After curing, the Cu particles 153 with Cu—Sn intermetallic compound shells 154, and the remaining Bi-heavy solder matrix 151 form a continuous conductive network through the solder paste 155. The spaces between the conductive network are filled by polymer 152. By way of example, and not by way of limitation, the cured no-slump solder paste 155 has resistance of approximately 50 μΩ/cm.

According to additional embodiments, the solder matrix may comprise a higher melting temperature solder, such as, for example, SnAgCu (SAC), SnSb, or SnCu. In such embodiments, the solder matrix melts at higher temperatures, such as those above approximately 215° C. However, once the solder matrix has liquefied, the liquid sintering and formation of intermetallic compounds is substantially similar to the process described above with low-melting point solder matrices, such as SnBi. According to an additional embodiment, the temperature may be maintained below the melting temperature of the high melting temperature solder. In such embodiments, the curing process may be driven by solid state diffusion.

Referring now to FIG. 2C, an exemplary depiction of the microstructure of a volatilized no-slump solder paste 156 according to an embodiment is shown. As shown, the volatilized no-slump solder paste 156 has had the polymer 152 removed from the spaces between the conductive network. According to an embodiment, the polymer 152 may be completely removed. In an embodiment, the polymer 152 may be partially removed. By way of example, polymer 152 may be volatilized or burned off. In an embodiment, sufficient removal of the polymer 152 may be obtained by holding the temperature between approximately 200° C. and 220° C. for approximately 60 seconds. As shown, removal of the polymer 152 from the no-slump solder paste produces a plurality of vents 157 through the conductive network of the high-melting point particles 153, the intermetallic compounds 154, and the solder matrix 151. The vents 157 provide pathways through which moisture may outgas. According to an embodiment, the size of the vents 157 are smaller than the particle size of the material chosen for the mold layer 160. Selecting the size of the vents 157 to be smaller than the size of the mold particles prevents the mold particles from filling in the vents 157. By way of example, and not by way of limitation, the vents may be approximately 50 μm or smaller. In an embodiment, the vents may be approximately 30 μm or smaller.

Figure 3:
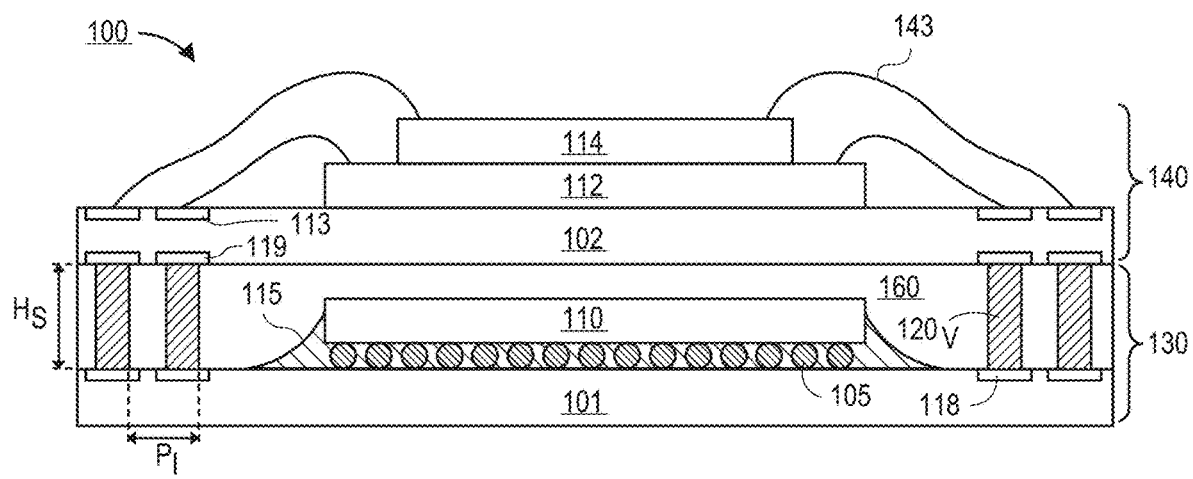
FIG. 3 illustrates a cross-sectional view of a package that utilizes a no-slump solder paste to form volatilized interconnects in accordance with an embodiment.

According to embodiments, no-slump solder pastes, such as those described above, may be used to form fine pitch interconnects 120 formed through a mold layer 160 that are capable of outgassing moisture without lifting up from the substrate. As shown in FIG. 3, fine pitch interconnects $120_V$ that are capable of out-gassing moisture without lifting up from the substrate 101 are shown in package 100. According to an embodiment, package 100 may be a PoP structure that includes a lower package 130 and an upper package 140. According to an embodiment, lower package 130 is formed on a first substrate 101. First substrate 101 may include one or more laminated layers with conductive circuitry to form a build-up structure. The first substrate 101 may be attached to a lower packaging layer, such as a printed circuit board with solder bumps (not shown). A plurality of contact pads 118 are formed on the surface of the first substrate on a peripheral portion of the first substrate 101 around the die 110. Contact pads 118 may be formed from materials typically used for conductive pads. By way of example, and not by way of limitation, the contact pads 118 may be Cu, Ni, or NiAg. According to an additional embodiment, the contact pads 118 may also include an organic surface protection (OSP) layer. According to an embodiment, the OSP layer may burn off during a reflowing or curing process.

A first die 110 is bonded and electrically coupled to the substrate 110. By way of example, the first die may be an integrated circuit (IC) such as a microprocessor. As shown in FIG. 3, the first die utilizes a controlled collapse chip connection (C4) or a flip chip electrical connection method. According to additional embodiments, alternative electrical connection methods may be used such as, for example, wire bonding. As shown, an insulative underfill material 115 may be formed around the solder bumps 105 after they have been reflown. By way of example, the underfill material 115 may be an epoxy material, as is known in the art.

Package 100 has a plurality of high aspect ratio interconnects $120_V$ formed on contact pads 118. By way of example, the aspect ratio of the interconnects $120_V$ may be approximately 2:1 or greater. In an embodiment, the interconnects $120_V$ comprise a volatilized no-slump solder paste 156 substantially similar to ones described above. Accordingly, interconnects $120_V$ include vents 157 that allow moisture to escape without causing the interconnects to lift up from the substrate 101. According to an embodiment, the height of the interconnects $120_V$ is chosen such that they provide the desired stand-off height $H_S$ needed to provide clearance for bonding an upper package 140 above the bottom package 130. According to an embodiment, the interconnects $120_V$ may have a height greater than 300 μm. In an embodiment, the widths of the interconnects $120_V$ may be 200 μm or less. In an embodiment, the widths of the interconnects $120_V$ may be 100 μm or less. Without the need to overdrill the openings in order to provide a path for moisture outgasing, the pitch $P_I$ of the interconnects $120_V$ can be reduced. In an embodiment, the pitch $P_I$ of the interconnects $120_V$ may be approximately 0.4 mm or less. By way of example, and not by way of limitation, the pitch $P_I$ of the interconnects $120_V$ may be approximately 0.2 mm or less. A mold layer 160 may be formed over the substrate 101 and along the sidewalls of the interconnects $120_V$. By way of example, the mold layer 160 may be a polymer or epoxy material.

As shown in FIG. 3, top surfaces of interconnects 120 are bonded to bonding pads 119 formed on a bottom surface of an upper package 140. Upper package 140 may include a second substrate 102. The second substrate may also be formed with one or more laminated layers with conductive circuitry to form a build-up layer. The conductive circuitry in the second substrate 102 may electrically couple the bonding pads 119 to contact pads 113 on the top surface of the second substrate 102. Wires 143 may provide electrical connections from contact pads 113 to the one or more dies 112 and 114 bonded to the second substrate. By way of example, and not by way of limitation, dies 112 and 114 may be memory devices.

According to an embodiment, a semiconductor package 100, as described above with respect to FIG. 3, may be formed according to a process described with respect to FIGS. 4A-4D.

Figure 4A:
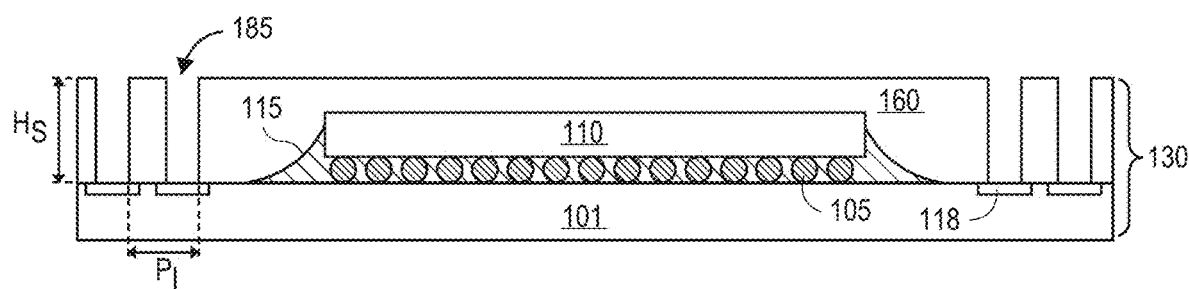
FIGS. 4A-4D illustrate cross-sectional views of a process for forming a semiconductor package according to various embodiments.

Referring now to FIG. 4A, a die 110 is bonded and electrically coupled to a substrate 101. By way of example, the die 110 may be an integrated circuit (IC) such as a microprocessor. As shown in FIG. 4A, the die 110 utilizes a flip chip electrical connection method. According to additional embodiments, alternative electrical connection methods such as, for example, wire bonding, may be used. According to an embodiment, the first die 110 is bonded to the first substrate with a thermocompression bonding (TCB) process that involves reflowing solder bumps 105 after the bumps have been placed in contact with the substrate 101. As shown, an insulative underfill material 115 may be deposited around the solder bumps 105 after they have been reflown. By way of example, the underfill material 115 may be an epoxy material, as is known in the art.

In an embodiment, a mold layer 160 may be formed over the surfaces of the substrate 101 and over the die 110. The mold layer 160 may have a thickness substantially equal to the desired thickness of the stand-off height $H_S$. In an embodiment, the mold layer 160 is a polymer or epoxy material. Through vias 185 are formed through the mold layer 160 to the substrate 101. Through vias 185 may have a pitch $P_I$. The pitch $P_I$ can be tight since there is no need for over drilling to allow for moisture outgassing. In an embodiment, the pitch $P_I$ may be less than 0.4 mm. In an embodiment, the pitch $P_I$ may be less than 0.2 mm. In an embodiment, the through vias 185 expose contacts 118 formed at the surface of the substrate 101. By way of example, the through vias 185 may be formed with a laser drilling process. According to an embodiment, through vias 185 have substantially vertical sidewalls with a uniform cross-section. In an additional embodiment, through vias 185 may have non-vertical sidewalls. For example, the bottom opening of the 185 via may have a smaller cross-section than the cross-section of the top opening of the via 185.

Figure 4B:
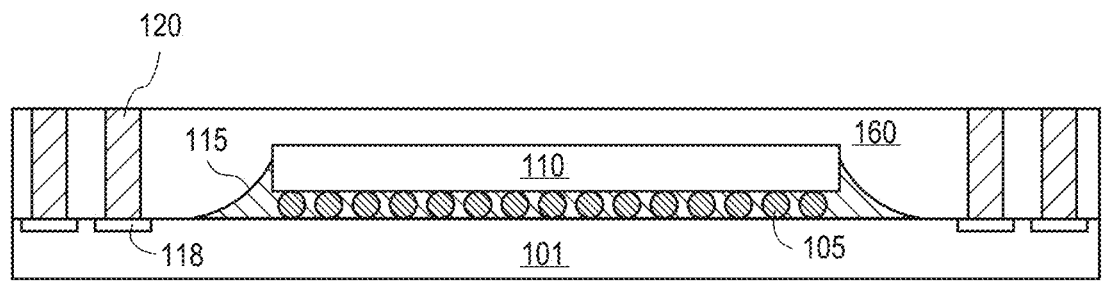

Referring now to FIG. 4B, interconnects 120 are formed in the through vias 185. In an embodiment, interconnects 120 are formed by depositing an uncured no-slump solder paste 150 substantially similar to those described above into the vias 185. In an embodiment, the uncured no-slump solder paste 150 includes a high-melting temperature metal 153, a solder matrix 151, and a polymer 152. In an embodiment, polymer 152 is a low molecular weight polymer. By way of example, the polymer 152 may have a molecular weight that is less than approximately 2,000 Da. According to an embodiment, the no-slump solder paste 150 is deposited into the through vias 185 with a stencil printing process. According to an embodiment, the stencil used for printing the uncured no-slump solder paste 150 is in direct contact with a top surface of the mold layer 160. In an additional embodiment, the stencil is maintained above the surface of the mold layer 160 during the printing process.

Figure 4C:
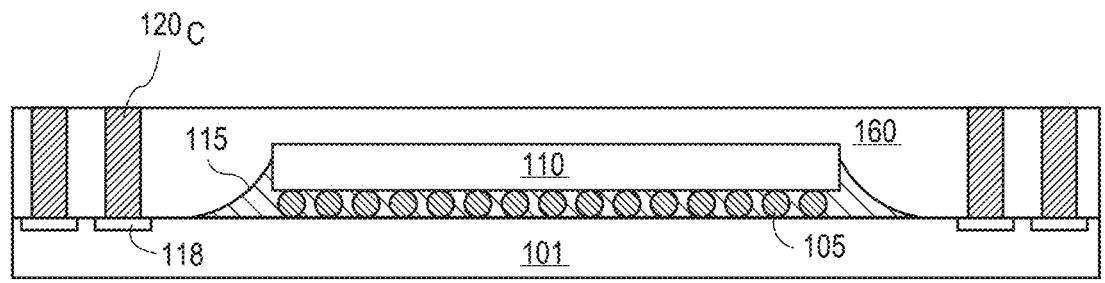

Referring now to FIG. 4C, the uncured no-slump solder paste is cured to form cured interconnects 120$_C$. In an embodiment, the curing process may include a temperature ramp to the sintering temperature. According to an embodiment that utilizes a liquid phase sintering process, the solder matrix 151, such as SnBi, will melt between 145° C. and 190° C. Liquid phase sintering may then occur at temperatures between 200° C. and 250° C. By way of example, and not by way of limitation, the temperature may be held at approximately 210° C. for 15 minutes. As described above, the liquid Sn sinters with the Cu particles 153 to form an intermetallic compound shell 154 around the Cu particles 153. In an embodiment, the curing process may also include Cu particles sintering together, portions of the intermetallic compounds sintering together, and/or sintering between Cu particles and intermetallic compounds. After the curing process, the melting temperature of the no-slump solder paste is increased, and it will not reflow when brought through the same temperature range during subsequent processing.

Figure 4D:
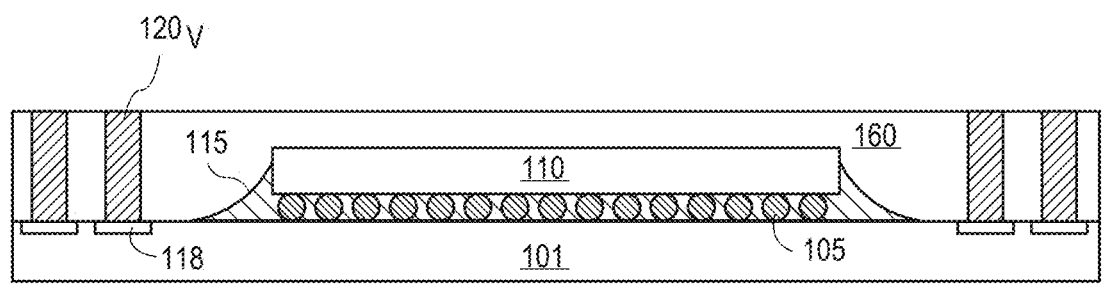

Referring now to FIG. 4D, the cured interconnects 120$_C$ are volatilized to form volatilized interconnects 120$_V$. According to an embodiment, the volatilizing process may be implemented as part of the curing process described above. Alternatively, the volatilizing process may be performed in a separate process. By way of example, the volatilizing process may volatilize or burn off the polymer 152 in the no-slump solder paste. Since the solder paste has been cured, the elevated temperatures of the volatilizing process will not cause the no-slump solder paste to reflow. The volatilizing process removes the polymer 152 from the no-slump solder paste and leaves behind vents 157 formed by the evacuated spacing between the conductive metallic network formed during the curing process, as described above with respect to FIG. 2C. The vents 157 provide passageways through the volatilized interconnects 120$_V$ that allow for moisture to outgas through the interconnect and exit the top, uncovered, surfaces of the volatilized interconnects 120$_V$. In an embodiment, the polymer 152 is completely removed from the volatilized interconnects 120$_V$. In an embodiment, a portion of the polymer 152 is removed from the volatilized interconnects 120$_V$. After the volatilizing process, an upper package 140 may be bonded and electrically coupled to the top surfaces of the interconnects 120 to form a package substantially similar to the package 100 illustrated in FIG. 3. According to an embodiment, the dies 112, 114 may be attached subsequent to the second substrate 102 being bonded to the interconnects 120. According to an embodiment, the second substrate 102 may have solder bumps with a fluxing agent formed on the bonding pads 119. During the bonding process, solder bumps reflow with molten solder diffusing into the top surface of the volatilized interconnects 120$_V$ to form a metallurgical joint.

According to an additional embodiment, the mold layer 160 may be formed subsequent to the volatilizing process used to form volatilized interconnects 120$_V$. In such embodiments, the vents 157 formed by evacuating the polymer 152 from between the conductive network in the interconnects 120$_V$ improves the adhesion between the mold layer 160 and the volatilized interconnects 120$_V$. The adhesion is improved because the vents 157 serve as anchoring points for the mold layer 160. Accordingly, the mechanical continuity of the mold layer 160 is improved and therefore, is able to provide improved warpage reduction.

Figure 5A:
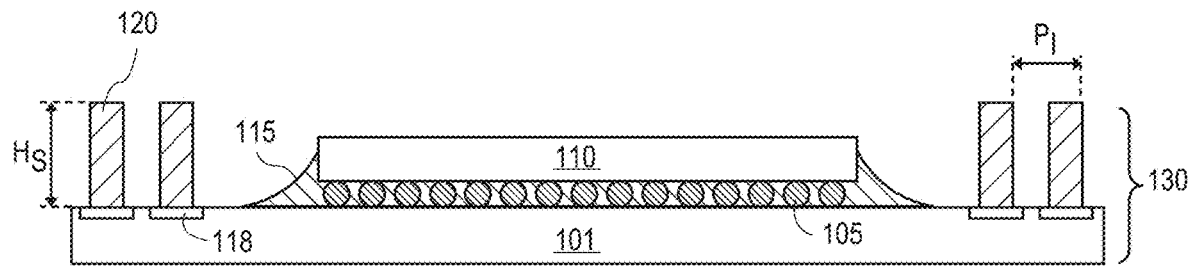
FIGS. 5A-5D illustrate cross-sectional views of a process for forming a semiconductor package according to various embodiments.

Referring now to FIG. 5A, a die 110 is bonded to a substrate 101 and interconnects 120 are printed over contacts 118. According to an embodiment, uncured no-slump solder paste 150 is printed onto the substrate 101 with a stencil printing process. In an embodiment, a deep stencil may be used in order to provide the adequate stand-off heights $H_S$. By way of example, and not by way of limitation, the stencil is as thick as the stand-off height $H_S$. According to an embodiment, the stencil may have a thickness slightly smaller than the stand-off height. In an embodiment, a deep stencil may be greater than 200 μm thick. By way of example, and not by way of limitation, the stencil may be a stainless steel stencil. In order to provide sufficient fill of the stencil, a pressure head may be used. Since the interconnects 120 are formed in a peripheral region around the die 110, the increased pressure will not damage the die 110. According to an embodiment, the printing process may be implemented with a gap between the bottom surface of the stencil and the top surface of the first substrate 101. Due to the rheological and thixotropic properties of the no-slump solder paste, the portion of the interconnect 120 formed below the stencil will not slump and cause a short between neighboring interconnects. According to an additional embodiment, the stencil may be in contact with the first substrate 101 during printing. According to an embodiment, the stencil has substantially vertical sidewalls with a uniform cross-section. In an additional embodiment, the stencil may have non-vertical sidewalls with the bottom opening being larger than the top opening. In such embodiments, the tapered sidewalls may improve the ease with which the stencil can be removed after printing. Due to the composition of the no-slump solder paste 150 and its desirable rheological and thixotropic properties, it will not slump and create shorts between neighboring interconnects 120 even though there is no lateral support from a mold layer 160.

Figure 5B:
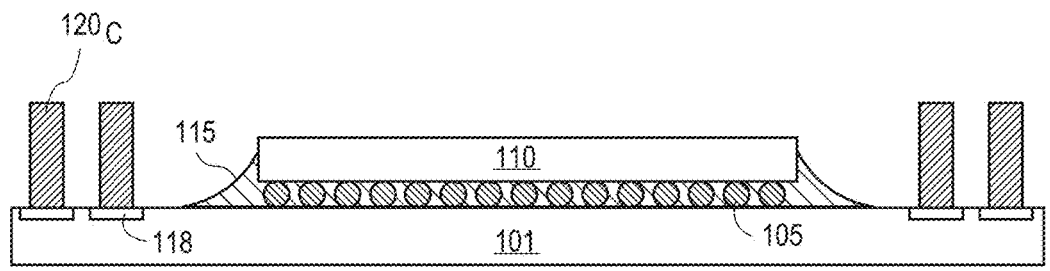
Figure 5C:
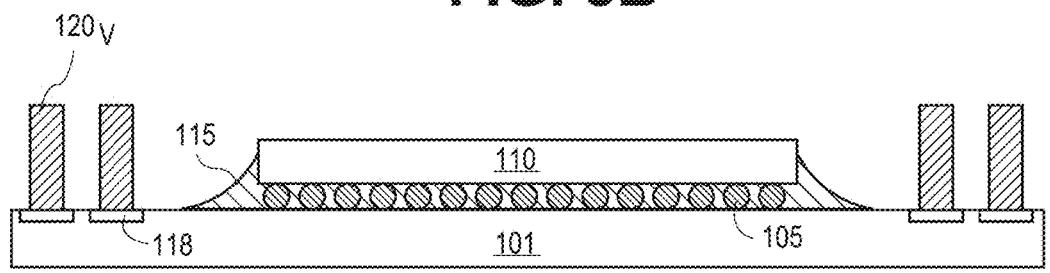
Figure 5D:
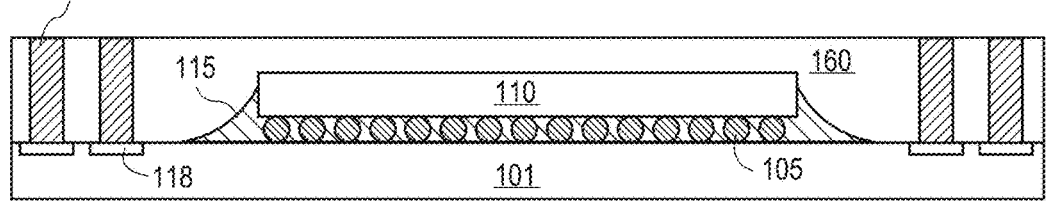

Referring now to FIG. 5B, the uncured no-slump solder paste 150 is cured with a curing process substantially similar to those described above in order to form cured interconnects $120_C$. FIG. 5C is an illustration after the interconnects have been volatilized to form volatilized interconnects $120_V$. The volatilized interconnects $120_V$ have vents 157 formed over their exposed surfaces as shown in FIG. 2C above. In addition to providing paths for outgassing moisture, the vents 157 also provide mechanical anchoring points for the mold layer 160 that may be formed over the substrate 101 and the die 110, as shown in FIG. 5D. According to an embodiment, the vents 157 in the volatilized interconnects $120_V$ have an average diameter that is smaller than the average particle size of the mold layer 160 in order to prevent the mold layer 160 from filling the vents 157 and blocking the outgassing paths. By way of example, and not by way of limitation, the average particle size of the mold layer 160 may be 30 μm or larger. In an additional embodiment, the average particle size of the mold layer 160 may be 50 μm or larger. The improved adhesion between the mold layer 160 and the volatilized interconnects $120_V$ provides mechanical continuity to the mold layer 160 which increases the ability of the mold layer to prevent warpage. Though not shown, an upper package 140 may be bonded to the top surfaces of the uppermost interconnect portion with substantially the same process described above with respect to FIG. 4D.

According to an additional embodiment, a layer of no-slump solder paste may be formed over the die 110 to form an overmold layer 165 in order to reduce the warpage of a semiconductor package. A no-slump solder paste substantially similar to those described above has a high modulus compared to polymeric or epoxy materials that may be used as a mold layer 160. By way of example, in no-slump solder pastes that include copper as the high-melting point metal 153, the elastic modulus of a cured no-slump solder paste 155 may be approximately 50% of bulk copper. Furthermore, the elastic modulus remains substantially constant over the range of temperatures experienced during the packaging process because the no-slump solder paste 155 does not have a glass transition temperature and will not reflow. In comparison, typical polymeric or epoxy materials have glass transition temperatures that are less than 200° C. When the glass transition temperature of a polymeric material is reached, the elastic modulus is reduced significantly, and no longer provides adequate stiffness to the die 110.

In an embodiment, the CTE of the no-slump solder paste is approximately matched to the CTE of the substrate 101. By way of example, and not by way of limitation, a no slump solder paste that includes copper particles for the high-melting temperature particles 152 has a CTE that is approximately 22 ppm/° C. and the CTE of a substrate 101 with a high copper content may be approximately equal to the CTE of copper, which is approximately 17 ppm/° C. In an embodiment, the CTE of the die 110 is lower than the CTE of the solder paste overmold layer 165 and the CTE of the substrate 101. By way of example, and not by way of limitation, the CTEs of the overmold layer 165 and the substrate 101 are at least twice as large as the CTE of the die 110. In an embodiment, the CTEs of the overmold layer 165 and the substrate 101 are at least five times as large as the CTE of the die 110. In an embodiment, the CTE of the die 110 may be approximately equal to the CTE of bulk silicon. By way of example, the CTE of the die may be between approximately 2-3 ppm/° C. Sandwiching the die 110 between layers that have higher CTEs provides additional warpage control, because the matching CTE of the substrate 101 and the overmold layer 165 counterbalance and prevent each other from warping the die 110.

Furthermore, the no-slump solder paste provides high thermal conductivity. By way of example, and not by way of limitation, a no-slump solder paste that includes copper as the high-melting point metal 153 may have a thermal conductivity of approximately 23 W/mK. In comparison, a polymeric material that may have a thermal conductivity of approximately 3 W/mK. Accordingly, an overmold layer 165 made from a no-slump solder paste may also be utilized in high power packages due to the enhanced thermal conductivity that is provided by the no-slump solder paste.

Accordingly, an overmold layer formed with a no-slump solder paste is capable of reducing warpage in the die area. Furthermore, the thickness of the overmold layer formed from a no-slump solder paste can be thinner than the thickness of the overmold layer that is formed with a polymer or epoxy while still maintaining a similar, or improved warpage reduction. By way of example, and not by way of limitation, in a package including a 10×10×0.06 mm silicon die on 14×14 mm coreless substrate, an overmold layer formed with a no-slump solder paste may be approximately 100 μm thick and be able to achieve coplanarity in the die region of less than 100 μm at room temperature and melting temperature. In contrast, a polymeric molding material would require a thickness of approximately 200 μm to obtain a similar level of coplanarity. Accordingly, the use of a no-slump solder paste overmold layer allows for reduced z-heights in a semiconductor package. It is noted that a 100 μm thick overmold layer is provided for exemplary purposes, and additional embodiments include overmold layers 165 that are thicker or thinner than 100 μm.

Figure 6:
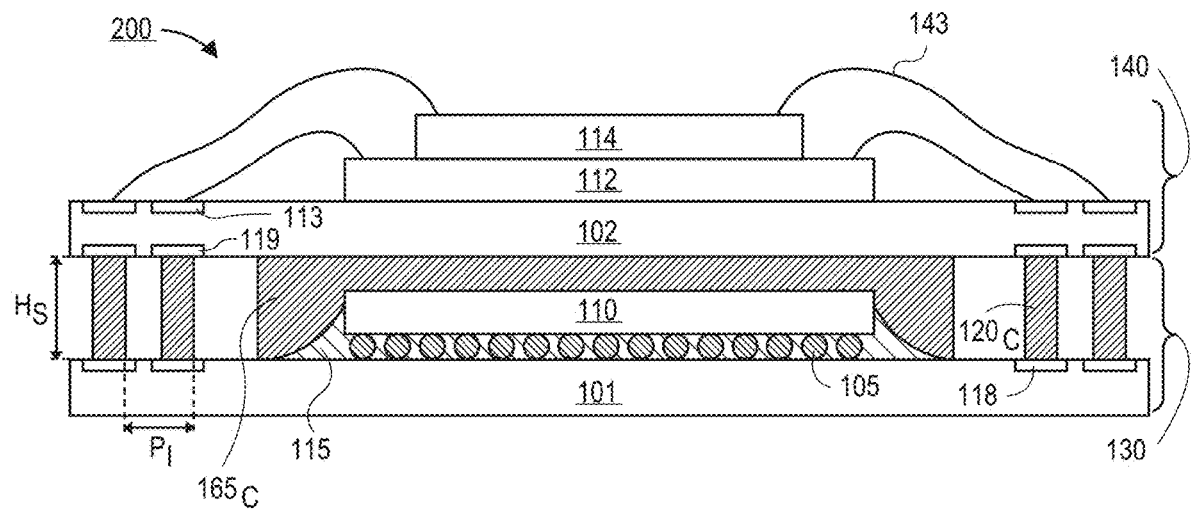
FIG. 6 illustrates a cross-sectional view of a package that utilizes a no-slump solder paste to form interconnects and an overmold over a die in accordance with an embodiment.

Referring now to FIG. 6, a cross-sectional view of a semiconductor package 200 having a cured overmold layer $165_C$ formed with a cured no-slump solder paste is shown.

In an embodiment, the semiconductor package 200 includes a bottom package 130 and an upper package 140. The upper package 140 is substantially similar to the one described above with respect to semiconductor package 100, and will not be repeated here. In an embodiment, bottom package 130 may include a die 110, a plurality of cured interconnects 120$_C$, and a cured overmold layer 165$_C$.

In an embodiment, the overmold layer 165$_C$ is formed over the die 110. As shown, the overmold layer 165$_C$ covers a top surface of the die 110 and continues down along sidewalls of the die 110, over the under fill material 115, and contacts a top surface of the substrate 101. In an embodiment, the overmold layer 165$_C$ may only cover a top surface of the die. The thickness of the overmold layer 165$_C$ above the die 110 is chosen such that it provides adequate stiffness to the die 110 to achieve the desired level of coplanarity. In an embodiment, the thickness of the overmold layer 165$_C$ above the die 110 is 200 μm or less. In an embodiment, the thickness of the overmold layer 165$_C$ above the die 110 is approximately 100 μm or less. According to an embodiment, the mold layer 165$_C$ is in direct contact with the surfaces of the die 110.

In an embodiment, the micro-structure of the cured no-slump solder paste limits the diffusion of metallic elements into the die 110. There are several mechanisms that prevent the diffusion of metallic elements, such as copper into the die 110. For example, during the curing process, the liquid phase sintering of the no-slump solder paste creates intermetallic compounds 154 that form a shell around the copper particles. Additionally, in embodiments in which the polymer component 152 of the no-slump solder paste is not volatilized, the polymer also serves as a diffusion barrier. Furthermore, retaining the polymer 152 in the no-slump solder paste 155 after curing improves the adhesion of the overmold layer 165$_C$ to the die 110. In an embodiment, the volume percentage of the no-slump solder paste attributable to the polymer 152 is increased in order to improve the protection against diffusion and to promote greater adhesion strength between the die and the overmold layer 165. According to an embodiment, an adhesion layer may be formed over the surfaces of the die 110 prior to forming the overmold layer 165$_C$. By way of example, the adhesion layer may be a layer of epoxy, adhesion promoting polymers, or a die backside film (DBF), as is known in the art.

Figure 7A:
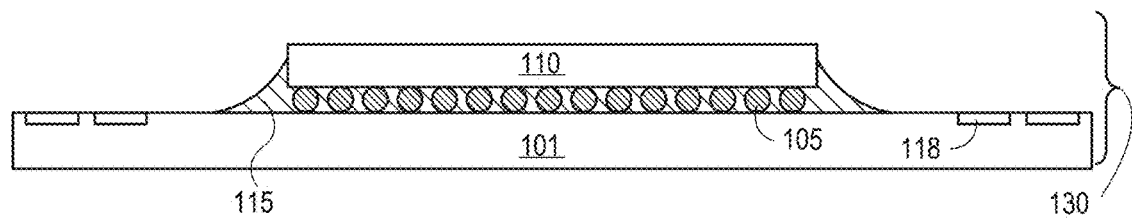
FIGS. 7A-7C illustrate cross-sectional views of a process for forming a semiconductor package according to various embodiments.
Figure 7B:
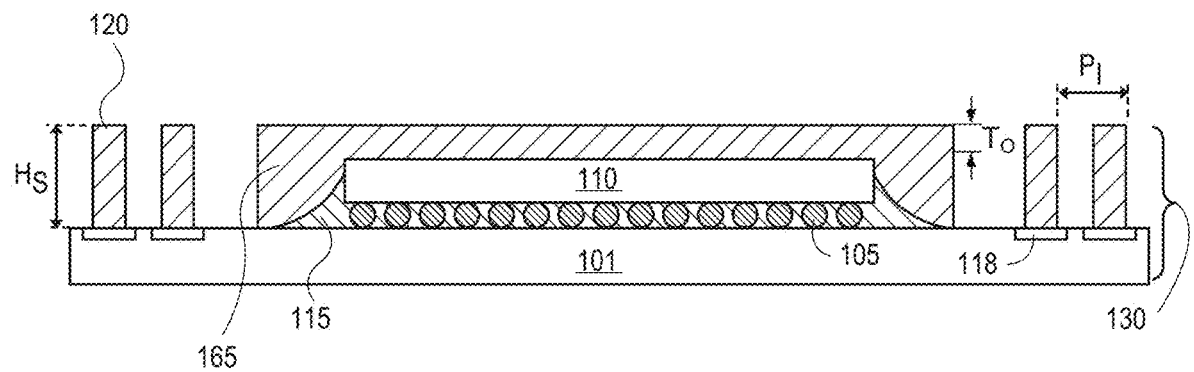
Figure 7C:
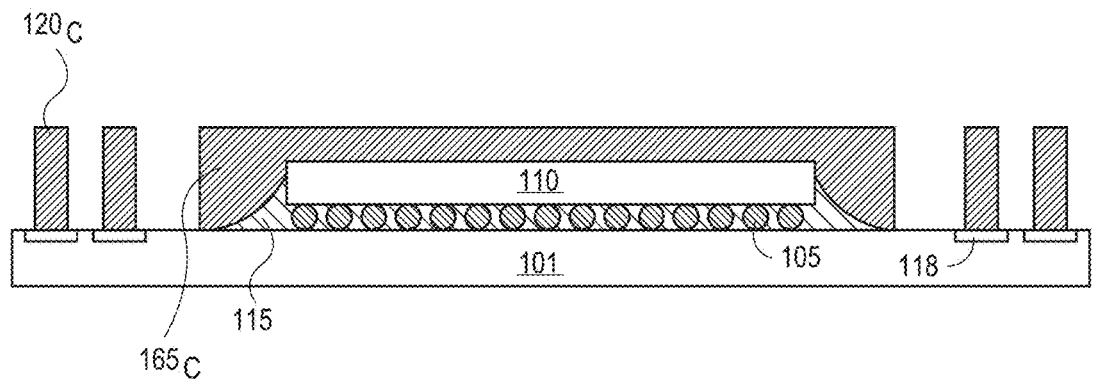

Referring now to FIGS. 7A-7C, a method of forming the bottom package 130 of a package 200 according to an embodiment is shown. In FIG. 7A, a die 110 is bonded to a substrate 101. As shown, the die 110 is bonded to the substrate 101 with an array of solder bumps 105. By way of example, a flip chip electrical connection method may be used to bond the die 110 to the substrate 101. According to additional embodiments, alternative electrical connection methods may be used such as, for example, wire bonding. As shown, an insulative underfill material 115 may be formed around the solder bumps 105 after they have been reflown. By way of example, the underfill material 115 may be an epoxy material, as is known in the art.

In FIG. 7B, an uncured no-slump solder paste is printed over the surface of the die 110 to form an overmold layer 165. According to an embodiment, interconnects 120 formed with a no-slump solder paste may also be printed onto the substrate 101. In an embodiment, the no-slump solder paste may be printed with a stencil printing process substantially similar to the stencil printing process described above with respect to FIG. 5A. As shown, the thickness overmold layer 165 may be printed to have a thickness $T_O$ above the die 110. In an embodiment, the thickness $T_O$ is approximately 200 μm or less. More specifically, embodiment include thicknesses $T_O$ that are approximately 100 μm or less. In an embodiment, the interconnects 120 and the overmold layer 165 are printed with a single printing process. According to an additional embodiment, the overmold layer 165 may be printed with a different printing process than the printing process used to print the interconnects 120. In embodiments that utilize two separate processes for printing the overmold layer 165 and the interconnects 120, each structure may be formed with no-slump solder pastes having different compositions. By way of example, and not by way of limitation, the interconnects 120 may be formed with a no-slump solder paste that has a low molecular weight polymer 152 that may be volatilized, whereas the overmold layer 165 may be formed with a no-slump solder paste that has a higher molecular weight polymer 152 that will not volatilize. Referring now to FIG. 7C, the overmold layer 165 and the interconnects 120 may be cured with a process substantially similar to those described above in order to form a cured overmold layer 165$_C$ and cured interconnects 120$_C$. Though not shown, an upper package 140 may be bonded to the top surfaces of the uppermost interconnect portion with substantially the same process described with respect to FIG. 4D.

Figure 8A:
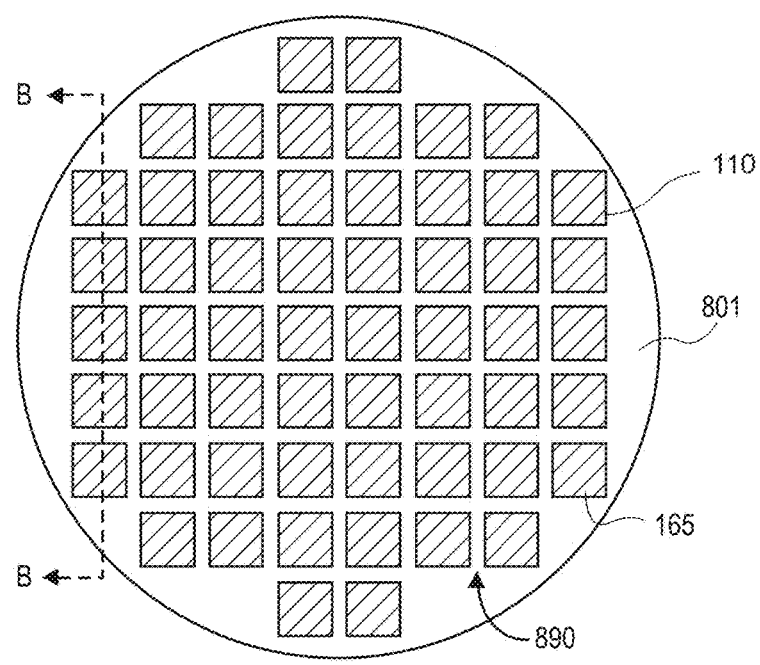
FIG. 8A is an overhead view of a semiconductor wafer with an overmold layer formed over dies according to an embodiment.

According to an additional embodiment, the overmold layer 165 may be formed over the die 110 before the die 110 is bonded to the substrate 101. As shown in FIG. 8A, a semiconductor wafer 800 having a plurality of dies 110 is shown. An overmold layer 165 is formed over each of the dies 110. According to an embodiment, the overmold layer 165 is printed over the dies 110, for example, with stencil printing. The use of a stencil allows for saw streets 890 to be formed between each of the dies. The presence of saw streets 890 between the overmold layer 165 simplifies the singulation process, because only silicon needs to be sawn through instead of having to saw through the metallic no-slump solder paste and the semiconductor substrate.

Figure 8B:
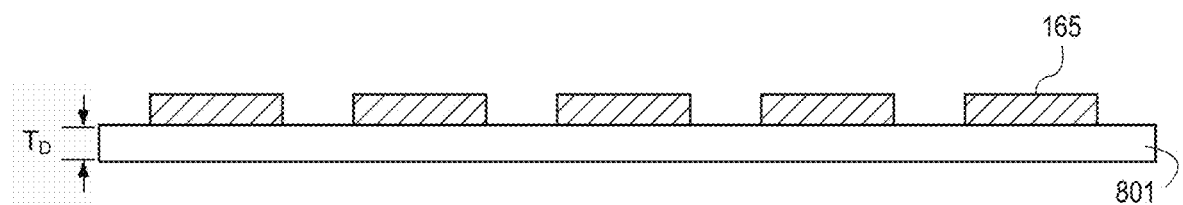
FIG. 8B is a cross-sectional view of the semiconductor wafer illustrated in FIG. 8A.

As shown in FIG. 8B, the thickness $T_D$ of the wafer can be significantly reduced when an overmold layer 165 is formed at the wafer level because of the additional stiffness provided by the no-slump solder paste. By way of example, and not by way of limitation, the thickness $T_D$ may be reduced to approximately 30 μm or less. Accordingly, the z-height of the package may be reduced. According to an embodiment, the thickness of the die 110 is reduced to an extent that the high aspect ratio interconnects are no longer required. In such embodiments, solder bumps may provide the desired stand-off height $H_S$.

After the overmold layer 165 has been printed onto the die 110 at the wafer level, and the die has been singulated, the die 110 may be bonded to the substrate 101. By way of example, the die may be bonded to the substrate with solder bumps, as shown in FIG. 7A. According to an embodiment, the no slump solder paste is cured during the solder bump reflowing used to attach the die 110 to the substrate 101. According to an embodiment, the no-slump solder paste is cured prior to bonding the die 110 to the substrate 101. By way of example, and not by way of limitation, the curing process may be implement before or after the die 110 has been singulated. In an embodiment, the overmold layer 165 may be cured subsequent to the die 110 being bonded to the substrate 101. Thereafter, the process of forming a package 200 including high aspect ratio interconnects may proceed in substantially the same manner as described above with respect to FIG. 7B-7C.

Figure 9:
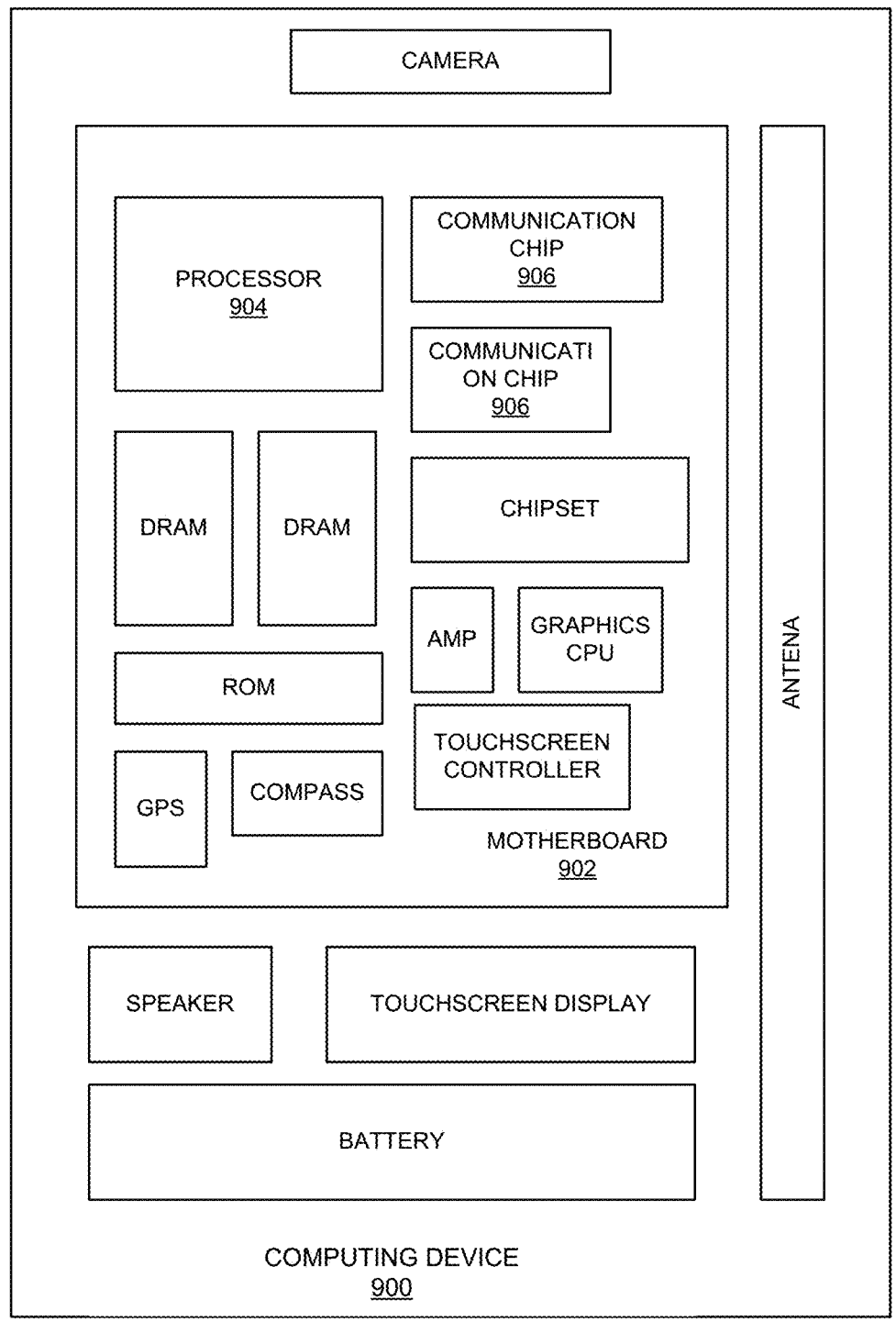
FIG. 9 is a schematic diagram of a computing device that utilizes a semiconductor package according to an embodiment.

FIG. 9 illustrates a computing device 900 in accordance with an embodiment. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some embodiments, the integrated circuit die of the processor is packaged in a semiconductor package including volatilized interconnects formed from a no-slump solder paste and/or a no-slump solder paste overmold layer, in accordance with an embodiment. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another embodiment, the integrated circuit die of the communication chip is packaged in a semiconductor package including volatilized interconnects formed from a no-slump solder paste and/or a no-slump solder paste overmold layer, in accordance with an embodiment.

In further implementations, another component housed within the computing device 900 may contain an integrated circuit die that includes one or more devices, such as devices that are packaged in a semiconductor package including volatilized interconnects formed from a no-slump solder paste and/or a no-slump solder paste overmold layer, in accordance with an embodiment.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Embodiments include a semiconductor package comprising, a substrate, a die bonded to the substrate, and a solder paste overmold layer formed over a top surface of the die, wherein the solder paste comprises a high-melting point metal and a solder matrix. An additional embodiment includes a semiconductor package, wherein the solder paste further comprises a polymer. An additional embodiment includes a semiconductor package, wherein an intermetallic layer is formed around an outer portion of the high-melting point metal. An additional embodiment includes a semiconductor package, wherein the high-melting point metal is copper and the solder matrix is SnBi. An additional embodiment includes a semiconductor package, wherein a thickness of the solder paste overmold layer over the die is 100 μm or less. An additional embodiment includes a semiconductor package, wherein the die is bonded to the substrate by a plurality of solder bumps and further comprises an underfill material between the solder bumps. An additional embodiment includes a semiconductor package further comprises an adhesion layer formed between the device die and the solder paste overmold layer. An additional embodiment includes a semiconductor package further comprises a plurality of interconnects formed around a peripheral region of the substrate, wherein the interconnects are formed from the solder paste and have an aspect ratio of 2:1 or greater.

Embodiments include a method of forming a semiconductor package comprising, bonding a die to a substrate, forming an overmold layer over a top surface of the die, wherein the overmold layer is a solder paste comprising a high-melting point metal, a solder matrix, and a polymer, and curing the solder paste. An additional embodiment includes a method of forming a semiconductor package, wherein curing the solder paste comprises a liquid phase sintering process. An additional embodiment includes a method of forming a semiconductor package, wherein the high-melting point metal includes copper particles and the solder matrix is a SnBi solder. An additional embodiment includes a method of forming a semiconductor package, wherein the polymer has a molecular weight less than approximately 2,000 Da. An additional embodiment includes a method of forming a semiconductor package, wherein the overmold layer is printed over the top surface of the die with a stencil printing process. An additional embodiment includes a method of forming a semiconductor package, wherein the overmold layer is printed over the top surface of the die before the die is singulated from a wafer comprising a plurality of dies. An additional embodiment includes a method of forming a semiconductor package, wherein saw streets are formed between each of the plurality of dies. An additional embodiment includes a method of forming a semiconductor package further comprising forming a plurality of interconnects having an aspect ratio greater than 2:1 on a peripheral region around the die with the solder paste. An additional embodiment includes a method of forming a semiconductor package, wherein the plurality of interconnects and the mold layer are formed with a single stencil printing process.

Embodiments include a semiconductor package comprising, a substrate, a mold layer formed over a top surface of the substrate, and one or more interconnects formed through the mold layer, wherein the interconnects are formed from a no-slump solder paste and comprise a conductive network having a plurality of vents formed through the conductive network. An additional embodiment includes a semiconductor package, wherein the one or more interconnects have an aspect ratio greater than approximately 2:1. An additional embodiment includes a semiconductor package, wherein the conductive network comprises a high melting point metal, a solder matrix, and intermetallic compounds. An additional embodiment includes a semiconductor package, wherein the high melting point metal is copper and the solder matrix is a SnBi solder. An additional embodiment includes a semiconductor package, wherein the vents have an average diameter that is smaller than an average particle size of the mold layer. An additional embodiment includes a semiconductor package, wherein the mold layer is mechanically anchored to the one or more interconnects by the vents. An additional embodiment includes a semiconductor package, wherein the interconnects have a stand-off height of 300 µm or greater and have a pitch less than approximately 0.4 mm.

Embodiments include a method of forming an interconnect comprising, providing a substrate, printing one or more interconnects onto the substrate, wherein the interconnects comprise a high-melting point metal, a solder matrix, and a polymer having a molecular weight less than approximately 2,000 Da, curing the interconnects, wherein the curing process includes liquid phase sintering, volatilizing the interconnects to at least partially remove the polymer, wherein the interconnects form a conductive network having a plurality of vents, and forming a mold layer over the substrate. An additional embodiment includes a method of forming an interconnect, wherein the interconnects have a height greater than 300 µm and a pitch less than 0.4 mm. An additional embodiment includes a method of forming an interconnect, wherein the mold layer is formed before the one or more interconnects are printed onto the substrate. An additional embodiment includes a method of forming an interconnect further comprising, drilling one or more through vias through the mold layer to expose contacts on the surface of the substrate, and printing the one or more interconnects into the through vias to form the one or more interconnects. An additional embodiment includes a method of forming an interconnect, wherein the high melting point metal is copper and the solder matrix is a SnBi solder. An additional embodiment includes a method of forming an interconnect, wherein the vents have an average diameter that is smaller than an average particle size of the mold layer.

Embodiments include a no-slump solder paste comprising, a high-melting point metal, a solder matrix, and a polymer with a molecular weight less than approximately 2,000 Da. An additional embodiment includes a no-slump solder paste, wherein the high-melting point metal is a SnSb-based alloy, a SnZn-based alloys, copper, an alloy of copper, nickel, or an alloy of nickel. An additional embodiment includes a no-slump solder paste, wherein the solder matrix is a SnBi solder, SnIn solder, or a SiInBi solder. An additional embodiment includes a no-slump solder paste, wherein the polymer accounts for between 10%-30% of the volume of the no-slum solder paste, and the solder matrix and the high-melting point metal combined account for between 70%-90% of the volume of the no-slump solder paste. An additional embodiment includes a no-slump solder paste, wherein high-melting point metal accounts for 50% or more of the weight of the no-slump solder paste. An additional embodiment includes a no-slump solder paste, wherein the solder matrix accounts for 50% or more of the weight of the no-slump solder paste. An additional embodiment includes a no-slump solder paste, wherein the average diameter of the particles of the high melting point metal is less than 50 µm.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method of forming a semiconductor package comprising:
   bonding a die to a substrate;
   forming an overmold layer over a top surface of the die, wherein the overmold layer is a solder paste comprising a high-melting point metal, a solder matrix, and a polymer;
   forming a plurality of interconnects having an aspect ratio greater than 2:1 on a peripheral region around the die with the solder paste; and
   curing the solder paste.

2. The method of claim 1, wherein curing the solder paste comprises a liquid phase sintering process.

3. The method of claim 1, wherein the high-melting point metal includes copper particles and the solder matrix is a SnBi solder.

4. The method of claim 1, wherein the polymer has a molecular weight less than approximately 2,000 Da.

5. The method of claim 1, wherein the overmold layer is printed over the top surface of the die with a stencil printing process.

6. The method of claim 5, wherein the overmold layer is printed over the top surface of the die before the die is singulated from a wafer comprising a plurality of dies.

7. The semiconductor package of claim 1, wherein a mold layer is mechanically anchored to the one or more interconnects by vents, wherein the vents provide mechanical anchoring points for the mold layer.

\* \* \* \* \*